United States Patent
Otake et al.

(10) Patent No.: US 7,768,067 B2
(45) Date of Patent: Aug. 3, 2010

(54) DMOS TRANSISTOR

(75) Inventors: Seiji Otake, Kumagaya (JP); Shuichi Kikuchi, Gunma (JP); Yasuhiro Takeda, Ogaki (JP); Kenichi Maki, Ibaraki (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 12/425,592

(22) Filed: Apr. 17, 2009

(65) Prior Publication Data
US 2009/0261410 A1    Oct. 22, 2009

(51) Int. Cl.
H01L 29/76  (2006.01)
H01L 29/94  (2006.01)
H01L 31/062 (2006.01)
H01L 31/113 (2006.01)
H01L 31/119 (2006.01)

(52) U.S. Cl. ........................ 257/335; 257/401
(58) Field of Classification Search ............... 257/335, 257/341, 342, 382, 401, E29.257
See application file for complete search history.

(56) References Cited

U.S. PATENT DOCUMENTS 7,187,033 B2 *  3/2007  Pendharkar ............... 257/339

FOREIGN PATENT DOCUMENTS

| JP | 10-233508 | 9/1998 |
|---|---|---|
| JP | 2004-039773 | 2/2004 |
| JP | 2004-079800 | 3/2004 |
| JP | 2007-128978 | 5/2007 |
| JP | 2007-535813 | 12/2007 |
| JP | 2008-034737 | 2/2008 |
| WO | WO-2005/112134 | 11/2005 |

* cited by examiner

Primary Examiner—Hoai v Pham
(74) Attorney, Agent, or Firm—Morrison & Foerster LLP

(57) ABSTRACT

This invention provides a DMOS transistor that has a reduced ON resistance and is prevented from deterioration in strength against an electrostatic discharge. An edge portion of a source layer of the DMOS transistor is disposed so as to recede from an inner corner portion of a gate electrode. A silicide layer is structured so as not to extend out of the edge portion of the source layer. That is, although the silicide layer is formed on a surface of the source layer, the silicide layer is not formed on a surface of a portion of a body layer, which is exposed between the source layer and the inner corner portion of the gate electrode. As a result, the strength against the electrostatic discharge can be improved, because an electric current flows almost uniformly through whole of the DMOS transistor without converging.

12 Claims, 2 Drawing Sheets

DMOS TRANSISTOR

CROSS-REFERENCE OF THE INVENTION

This application claims priority from Japanese Patent Application No. 2008-109713, the content of which is incorporated herein by reference in its entirety.

BACKGROUND OF THE INVENTION

1. Field of the Invention

This invention relates to a DMOS (Double-diffused MOS) transistor.

2. Description of the Related Art

The DMOS transistor is a MOS field effect transistor in which a source layer and a body layer that makes a channel are formed by double diffusion of impurities, and is used as a power semiconductor device for a power supply circuit, a driver circuit or the like.

In recent years, because of requirements for electronic equipment such as mobile phones to reduce their size and power consumption, the DMOS transistor is required to reduce its ON resistance (a resistance of the DMOS transistor when it is turned on).

Technologies to reduce the ON resistance and to improve a withstand voltage and the like of the DMOS transistor are disclosed in Japanese Patent Application Publication Nos. H10-233508, 2004-39773, 2004-79800, 2007-128978, 2007-535813 and 2008-34737.

Forming a silicide layer, which is a product of reaction between silicon and a transition metal such as cobalt or titanium, on a surface of a source layer or the like is effective to reduce the ON resistance of the DMOS transistor. However, there is a problem that the silicide layer tends to cause convergence of an electric field and an electric current in the transistor and deteriorate strength of the DMOS transistor against electrostatic discharge, since the silicide layer is low in resistance.

SUMMARY OF THE INVENTION

The invention provides a DMOS transistor that includes a semiconductor layer, a body layer of a first general conductivity type formed in a surface portion of the semiconductor layer, a source layer of a second general conductivity type formed in a surface portion of the body layer, a silicide layer formed on the source layer, and a gate electrode disposed on the semiconductor layer and having a shape of a closed loop so as to surround the body layer and the source layer in plan view of the transistor. The silicide layer is not formed in a space between the source layer and the gate electrode in the plan view.

With the structure described above, the ON resistance of the DMOS transistor can be reduced since the silicide layer is placed on the surface of the source layer.

Also, the deterioration in the strength against electrostatic discharge can be prevented since the DMOS transistor adopts the structure in which an edge portion of the source layer recedes from the inner corner portion of the gate electrode and the silicide layer is not formed on the surface portion of the body layer exposed between the source layer and the inner corner portion of the gate electrode so that the electric field at the edge portion of the source layer is relaxed and the convergence of the electric current is not likely to occur when electric charges associated with a surge current are introduced from outside the DMOS transistor.

DETAILED DESCRIPTION OF THE INVENTION

A DMOS transistor according to an embodiment of this invention can be incorporated in an IC (Integrated Circuit) as a power semiconductor device such as a power supply circuit or a driver circuit. It realizes a low ON resistance (100 mΩ, for example), and is prevented from the deterioration in the strength against electrostatic discharge by forming a silicide layer using a silicidation technology so that the electric field and the electric current do not converge.

Figure 1:
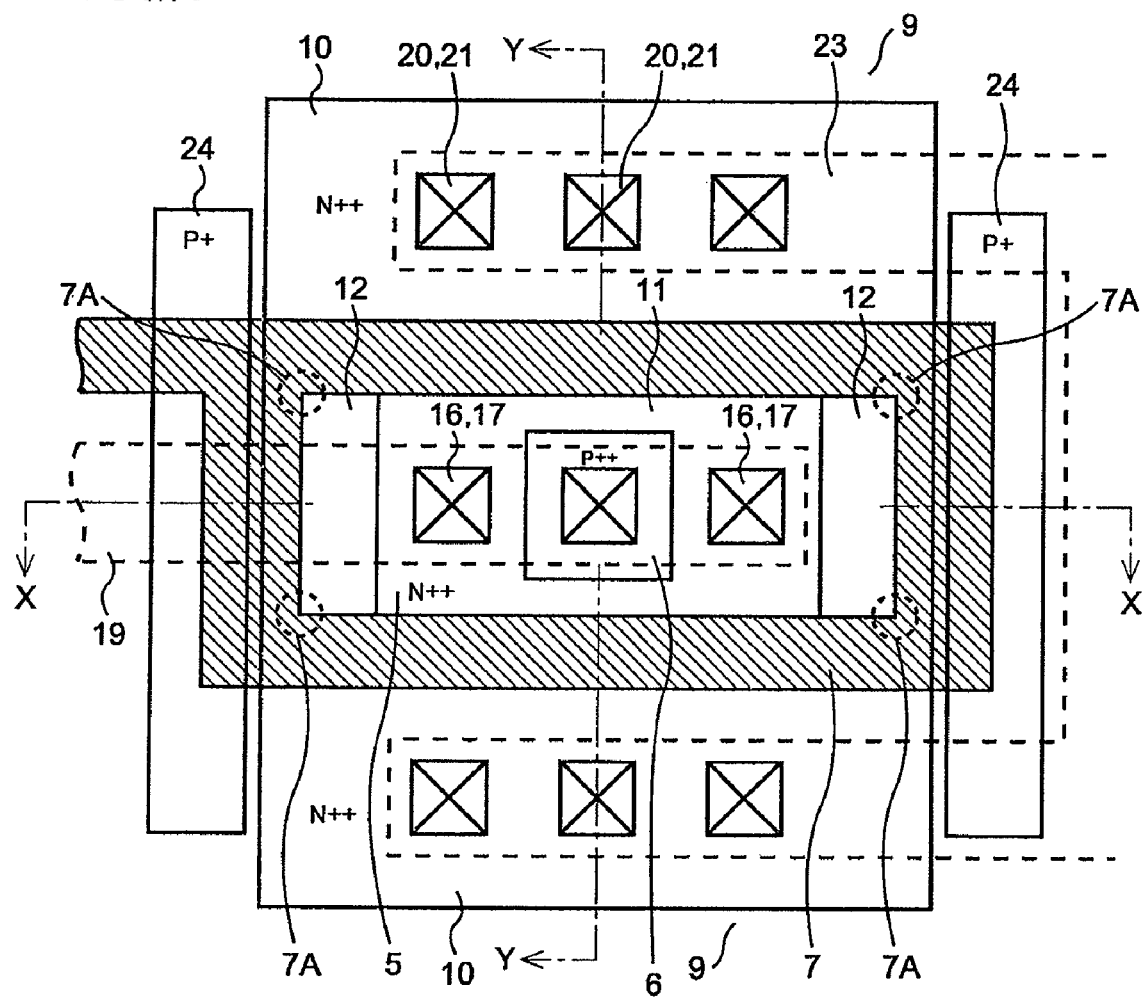
FIG. 1 is a plan view of a DMOS transistor according to an embodiment of this invention.
Figure 2:
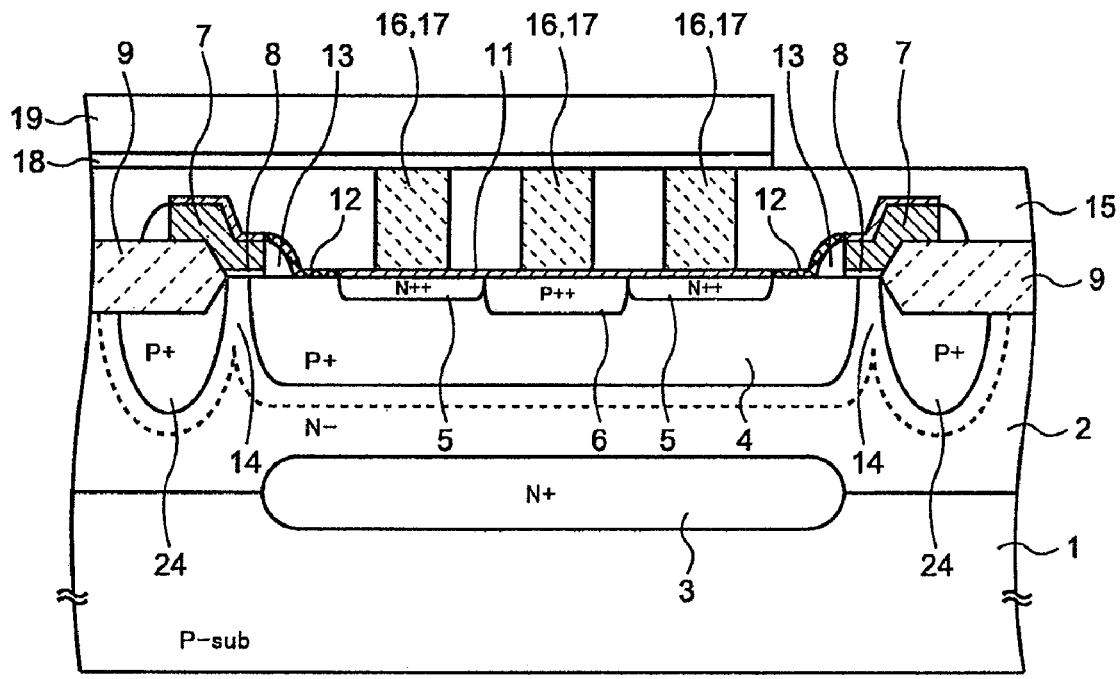
FIG. 2 is a cross-sectional view showing a section X-X in FIG. 1.
Figure 3:
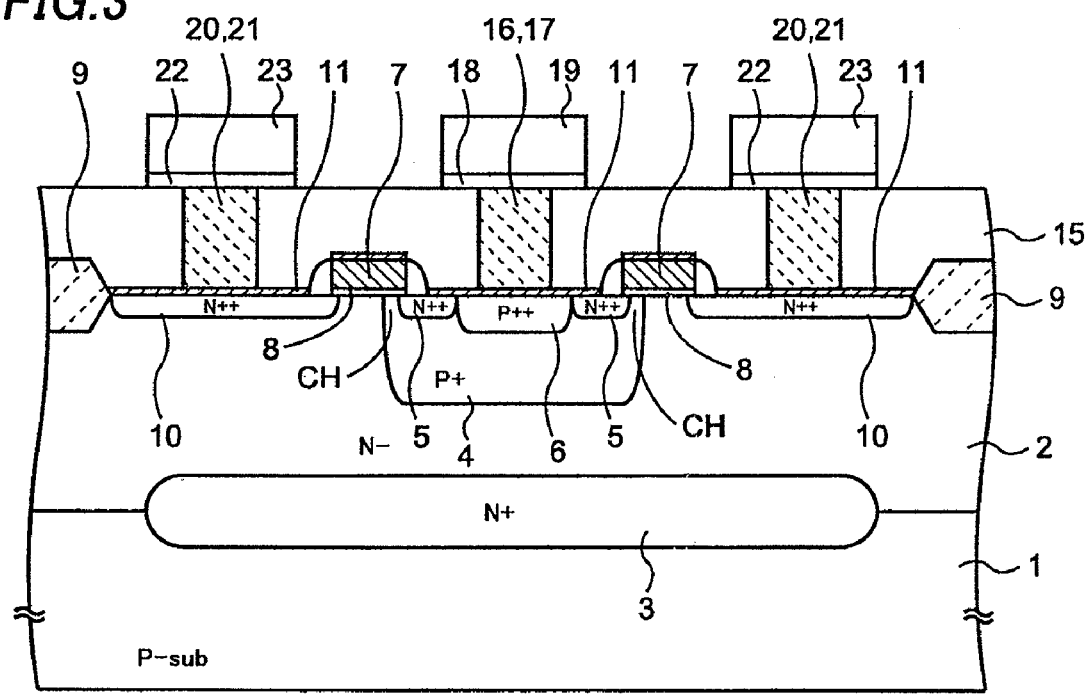
FIG. 3 is a cross-sectional view showing a section Y-Y in FIG. 1.

A structure of the DMOS transistor is hereafter described referring to the drawings. FIG. 1 is a plan view of the DMOS transistor according to the embodiment of this invention. FIG. 2 is a cross-sectional view showing a section X-X in FIG. 1. FIG. 3 is a cross-sectional view showing a section Y-Y in FIG. 1.

A silicon layer 2 of $N^-$ type is formed on a silicon substrate 1 of P type by epitaxial growth, as shown in the figures. It is preferable that a buried layer 3 of $N^+$ type that is higher in impurity concentration than the silicon layer 2 is formed on a border between the silicon substrate 1 and the silicon layer 2. The buried layer 3 is provided to reduce a drain resistance of the DMOS transistor, and is formed by diffusing N type impurities such as antimony (Sb), which have been introduced into the silicon substrate 1, upward into the silicon layer 2 during the epitaxial growth.

A body layer 4 of $P^+$ type is formed in a surface portion of the silicon layer 2 by diffusing P type impurities. A source layer 5 of $N^{++}$ type is formed in a surface portion of the body layer 4. It is preferable that a body electric potential setting layer 6 of $P^{++}$ type, which is to set an electric potential of the body layer 4, is formed in a surface portion of the body layer 4. The body electric potential setting layer 6 is surrounded by the source layer 5.

A gate electrode 7 is formed in a shape of a ring surrounding the body layer 4 and the source layer 5. The gate electrode 7 has four corner portions 7A (indicated by dashed line circles in FIG. 1) at inner corner portions of the ring. It is noted that the $N^+$ type means higher impurity concentration in a diffusion layer than the $N^-$ type, and that the $N^{++}$ type means higher impurity concentration in a diffusion layer than the $N^+$ type. Similarly, the $P^{++}$ type means higher impurity concentration in a diffusion layer than the $P^+$ type. Conductivity types such as $N^{++}$, $N^+$, N and $N^-$ belong in one general conductivity type, and conductivity types such as $P^{++}$, $P^+$, P and $P^-$ belong in another general conductivity type.

The gate electrode 7 is formed on an insulation film 8 that is formed on the surface of the silicon layer 2. Left and right edge portions of the gate electrode 7 extend from above the gate insulation film 8 to over an electric field relaxing insulation film 9 that is formed to surround the DMOS transistor. The electric field relaxing insulation film 9 that is thicker than the gate insulation film 8 is formed by a LOCOS (Local Oxidation of Silicon) method, for example, and serves to relax a gate electric field of the DMOS transistor (Refer to FIGS. 1 and 2).

The body layer 4 is formed to be self-aligned to inner edge portions of the gate electrode 7 by an ion implantation method using the gate electrode 7 as a mask. An edge portion of the body layer 4 extends laterally up to the silicon layer 2 below the edge portion of the gate electrode 7. A portion of the body layer 4 that is below the gate electrode 7 and overlapping the gate electrode 7 makes a channel region CH (Refer to FIG. 3). A drain layer 10 of $N^{++}$ type is formed in a surface portion of the silicon layer 2 adjacent the outer edge of the gate electrode 7.

In the DMOS transistor structured as described above, when a voltage higher than a threshold value is applied to the gate electrode 7, the channel region CH is turned from the P type to the N type to turn the DMOS transistor on. When a voltage is applied between the source layer 5 and the drain layer 10 while the DMOS transistor is in the state described above, a source-drain electric current path is formed from the source layer 5 to the drain layer 10 through the silicon layer 2.

In the DMOS transistor according to the embodiment of this invention, a silicide layer 11 made of titanium (Ti) silicide, cobalt (Co) silicide or the like is formed on surfaces of the source layer 5, the body electric potential setting layer 6 and the drain layer 10 in order to reduce the ON resistance of the DMOS transistor.

In the structure described above, when electric charges associated with a surge current are introduced from outside the DMOS transistor, the convergence of the electric field is more likely to occur at the inner corner portions 7A of the gate electrode 7. Therefore, the edge portion of the source layer 5 is not in contact with the inner corner portion 7A of the gate electrode 7. Note the separation corresponding to silicidation prevention film 12 between source layer 5 and inner corner portion 7A shown in FIG. 1.

In the case where the silicide layer 11 on the source layer 5 is extended from the edge portion of the source layer 5 toward the corner portion 7A along the surface of the body layer 4, an electric current converges on the extended portion of the silicide layer 11 to likely cause destruction of the DMOS transistor. It is because the silicide layer 11 is low in resistance and the electric field is relatively strong at the inner corner portion 7A of the gate electrode 7.

In the DMOS transistor according to the embodiment, therefore, the silicide layer 11 is structured so as not to extend out of the edge portion of the source layer 5. That is, although the silicide layer 11 is formed on the surface of the source layer 5, the silicide layer 11 is not formed on a surface of a portion of the body layer 4, which is exposed between the source layer 5 and the inner corner portion 7A of the gate electrode 7. The strength of the DMOS transistor against the electrostatic discharge can be improved as a result, since the electric current flows almost uniformly through whole of the DMOS transistor without converging.

One of the ways to prevent the silicide layer 11 from extending out of the source layer 5 is to form a silicidation prevention film 12 made of a silicon oxide film or the like on the surface of the portion of the body layer 4, which is exposed between the source layer 5 and the inner corner portion 7A of the gate electrode 7 (Refer to FIGS. 1 and 2). Since a sidewall spacer 13 is formed on each of sidewalls of the gate electrode 7 in the DMOS transistor according to the embodiment of this invention, the silicidation prevention film 12 is formed to cover from the surface of the exposed body layer 4 to the sidewall spacer 13.

In a silicidation process, a transition metal such as Ti is deposited by sputtering over the source layer 5 and the silicidation prevention film 12, and a silicidation reaction is caused by subsequent thermal treatment. At that time, the silicidation reaction does not take place on the silicidation prevention film 12 where the transition metal does not make contact with silicon. The transition metal left unreacted on the silicidation prevention film 12 is selectively removed with an etching solution. The silicide layer 11 can be selectively formed only on the source layer 5 and the body electric potential setting layer 6 as described above. It is possible to form the silicide layer 11 on a surface of the gate electrode 7 simultaneously by not covering the surface of the gate electrode 7 with the silicidation prevention film 12.

It is preferable to form an electric field relaxing layer 24 of $P^+$ type to further relax the electric field at the edge portion of the source layer 5. The electric field relaxing layer 24 is adjacent the edge portion of the source layer 5 receding from the inner corner portion 7A of the gate electrode 7, and is formed by introducing $P^+$ type impurities such as boron into the silicon layer 2. It is further preferable that the electric field relaxing layer 24 is formed below the electric field relaxing insulation film 9 over which the gate electrode 7 is extended (Refer to FIGS. 1 and 2).

With the structure provided with the electric field relaxing layer 24 described above, a depletion layer around the body layer 4 and a depletion layer around the electric field relaxing layer 24 are merged into a unified depletion layer 14 that relaxes the electric field at the edge portion of the source layer 5 to further enhance the strength against the electrostatic discharge.

Finally, a structure to extract electrodes of the DMOS transistor is described. The entire surface of the DMOS transistor is covered with an interlayer insulation film 15 made of BPSG (Boro-Phospho Silicate Glass) or the like. Contact holes 16 are formed in the interlayer insulation film 15 above the source layer 5 and the body electric potential setting layer 6, and each of the contact holes 16 is filled with a metal post 17 made of tungsten or the like. A source wiring layer 19 (depicted by dashed lines in FIG. 1) made of Al—Si—Cu alloy or the like is formed on a surface of the interlayer insulation film 15 through a barrier layer 18. Thus, the source layer 5 and the body electric potential setting layer 6 are electrically connected to the source wiring layer 19. As a result, an electric potential of the body layer 4 and an electric potential of the source layer 5 are set to the source electric potential provided through the source wiring layer 19 (Refer to FIG. 2).

Similarly, a contact hole 20 is formed in the interlayer insulation film 15 above the drain layer 10, and the contact hole 20 is filled with a metal post 21 made of tungsten or the like. A drain wiring layer 23 (depicted by dashed lines in FIG. 1) made of Al—Si—Cu alloy or the like is formed on the surface of the interlayer insulation film 15 through a barrier layer 22. Thus, the drain layer 10 is electrically connected to the drain wiring layer 23 (Refer to FIG. 3).

It is apparent that this invention is not limited to the embodiment described above and may be modified within the scope of the invention. For example, although the N-channel type DMOS transistor is exemplified and described in the embodiment, this invention may be applied to a P-channel type DMOS transistor as well.

With the DMOS transistor according to the embodiment of this invention, the strength of the DMOS transistor against the electrostatic discharge can be prevented from deterioration, while its ON resistance is reduced.

What is claimed is:

1. A DMOS transistor comprising:
   a semiconductor layer;
   a body layer of a first general conductivity type formed in a surface portion of the semiconductor layer;
   a source layer of a second general conductivity type formed in a surface portion of the body layer;

a silicide layer formed on the source layer; and a gate electrode disposed on the semiconductor layer and having a shape of a closed loop so as to surround the body layer and the source layer in plan view of the transistor, wherein the silicide layer is not formed in a space between the source layer and the gate electrode in the plan view.

2. The DMOS transistor of claim 1, further comprising a silicidation prevention film covering the space between the source layer and the gate electrode so as to prevent formation of the silicide layer in the space.

3. The DMOS transistor of claim 2, further comprising an electric field relaxing semiconductor layer of the first general conductivity type formed in the semiconductor layer adjacent an edge portion of the source layer.

4. The DMOS transistor of claim 3, further comprising a gate insulation film and an electric field relaxing insulation film, wherein the gate electrode covers at least part of the gate insulation film and part of the electric field relaxing insulation film, and the electric field relaxing semiconductor layer is disposed below the electric field relaxing insulation film.

5. The DMOS transistor of claim 1, further comprising an electric field relaxing semiconductor layer of the first general conductivity type formed in the semiconductor layer adjacent an edge portion of the source layer.

6. The DMOS transistor of claim 5, further comprising a gate insulation film and an electric field relaxing insulation film, wherein the gate electrode covers at least part of the gate insulation film and part of the electric field relaxing insulation film, and the electric field relaxing semiconductor layer is disposed below the electric field relaxing insulation film.

7. A DMOS transistor comprising:

a semiconductor layer;

a body layer of a first general conductivity type formed in a surface portion of the semiconductor layer;

a source layer of a second general conductivity type formed in a surface portion of the body layer;

a silicide layer formed on the source layer; and a gate electrode disposed on the semiconductor layer and having a shape of a closed loop so as to surround the body layer and the source layer in plan view of the transistor, the closed loop having an inner corner portion, wherein there is a separation between the inner corner portion of the gate electrode and the source layer in the plan view, and the silicide layer is not formed in an area of the semiconductor layer corresponding to the separation.

8. The DMOS transistor of claim 7, further comprising a silicidation prevention film covering the area of the semiconductor layer corresponding to the separation so as to prevent formation of the silicide layer in the area.

9. The DMOS transistor of claim 8, further comprising an electric field relaxing semiconductor layer of the first general conductivity type formed in the semiconductor layer adjacent the inner corner portion.

10. The DMOS transistor of claim 9, further comprising a gate insulation film and an electric field relaxing insulation film, wherein the gate electrode extends to cover at least part of the gate insulation film and part of the electric field relaxing insulation film, and the electric field relaxing semiconductor layer is disposed below the electric field relaxing insulation film.

11. The DMOS transistor of claim 7, further comprising an electric field relaxing semiconductor layer of the first general conductivity type formed in the semiconductor layer adjacent the inner corner portion.

12. The DMOS transistor of claim 11, further comprising a gate insulation film and an electric field relaxing insulation film, wherein the gate electrode extends to cover at least part of the gate insulation film and part of the electric field relaxing insulation film, and the electric field relaxing semiconductor layer is disposed below the electric field relaxing insulation film.

* * * * *